(12) United States Patent
Terletzki

(10) Patent No.: US 6,459,300 B1
(45) Date of Patent: Oct. 1, 2002

(54) LEVEL-SHIFTING CIRCUITRY HAVING "HIGH" OUTPUT DURING DISABLE MODE

(75) Inventor: Hartmud Terletzki, Pleasant Valley, NY (US)

(73) Assignee: Infineon Technologies AG, Munich (DE)

( * ) Notice: Subject to any disclaimer, the term of this patent is extended or adjusted under 35 U.S.C. 154(b) by 0 days.

(21) Appl. No.: 09/671,915

(22) Filed: Sep. 28, 2000

(51) Int. Cl.[7] ............................................. H03K 19/094
(52) U.S. Cl. ........................................... 326/68; 326/80
(58) Field of Search .............................. 326/68, 62–63, 326/80–83, 86–87, 112, 119, 121

(56) References Cited

U.S. PATENT DOCUMENTS 5,739,700 A * 4/1998 Martin ........................ 326/80
6,020,762 A * 2/2000 Wilford ....................... 326/81
6,147,511 A * 11/2000 Patel et al. ................... 326/81

* cited by examiner

*Primary Examiner*—Michael Tokar
*Assistant Examiner*—James H Cho
(74) *Attorney, Agent, or Firm*—Stanton Braden

(57) ABSTRACT

Level-shifting circuitry having a level-shifting section and an enable/disable section. The level-shifting section is responsive to an input logic signal. The input logic signal has a first voltage level representative of a first logic state and a second voltage level representative of a second logic state. The level-shifting section provides an output logic signal, such output logic signal having a third voltage level representative of the first logic state of the input logic signal. The enable/disable section is responsive to an enable/disable signal for driving the output logic signal to the third voltage level during a disable mode, such third voltage level being greater than the first or second voltage levels.

11 Claims, 2 Drawing Sheets

LEVEL-SHIFTING CIRCUITRY HAVING "HIGH" OUTPUT DURING DISABLE MODE

BACKGROUND OF THE INVENTION

This invention relates generally to level-shifting circuitry.

As is known in the art, level-shifting circuitry is used to shift lower voltage signal levels to higher voltage signal levels. One example of such circuit is shown in FIG. 1. Such circuit is formed on a semiconductor chip and includes a pair of N type Metal Oxide Semiconductor Field Effect Transistors (MOSFETs) $N_1$ and $N_2$ and a pair of P type MOSFETs $P_1$ $P_2$ arranged as shown. The P type MOSFETs have the bulk silicon connected to an external +2.5 volt power source. The N type MOSFETs have the bulk silicon connected to ground. The N type MOSFET $N_1$ is a low threshold voltage transistor. The gate of transistor $N_1$ is connected to an internal +2.1 volt source. The input voltage (IN) is a logic signal having logic 1, here represented by +2.1 volt level or a logic 0 state, here represented by ground potential. Here, the level-shifter also provides an inversion in the logic state of the input signal as well as shifting the input signal logic 1 state from +2.1 volts to a higher voltage output signal logic 1 state, here +2.5 volts. Thus, in operation, when the input voltage is logic 0, transistors $N_1$, and $P_2$ are "on" and transistors $P_1$ and $N_2$ are "off", thereby providing a logic 1, here a +2.5 volt level, at the output OUT. Thus, the input logic 1 condition of a +2.1 volt input signal level has been shifted to a +2.5 volt output logic 1. On the other hand, when the input voltage IN is logic 1 (i.e., here +2.1 volts), transistors $N_1$, and $P_2$ are "off" and transistors $P_1$ and $N_2$ are "on", thereby providing ground potential (i.e., an output logic 0) at the output OUT.

SUMMARY

In accordance with the present invention, level-shifting circuitry is provided having a level-shifting section responsive to an input logic signal. The input logic signal has a first voltage level representative of a first logic state or a second voltage level representative of a second logic state. The level-shifting section provides an output logic signal having a third voltage level representative of the first logic state of the input logic signal. The level-shifting circuitry also includes an enable/disable section responsive to an enable/disable signal for driving the output logic signal to the third voltage level during a disable mode.

In one embodiment, the level-shifting section includes: an input transistor having a control electrode, a first electrode coupled to the input logic signal, and a second electrode. An output pair of serially coupled complementary type transistors is provided. A first one of the pair of transistors has a first electrode coupled to a source of the third voltage level and a control electrode coupled to a second electrode of the input transistor. (It should be noted that in the case of a FET, the terms first and second electrode refer to source and drain electrodes, it being understood that while each transistor has a source and drain electrode, the terms may be used interchangeable. Further, in the case of a FET, the term control electrode refers to the gate electrode). A junction between the output pair of transistors provides an output terminal for the level-shifting circuitry. A control electrode of the second one of the pair of transistors is connected to the first electrode of the input transistor.

In one embodiment, the level-shifting section includes an additional transistor. The additional transistor has a control electrode connected to the junction, a first electrode coupled to the source of the third voltage level and a second electrode connected to the second electrode of the input transistor. In one embodiment, the input transistor and the additional transistor are of opposite conductivity type.

In one embodiment, the enable/disable section includes first, second, third and fourth enable/disable transistors. The first enable/disable transistor has a first electrode connected to the source of the third voltage level, a second electrode connected to the junction, and a control electrode. The second enable/disable transistor having a first electrode connected to the source of the third voltage level, a second electrode, and a control electrode connected to a second electrode of the second one of the pair of transistors. The third enable/disable transistor has a first electrode coupled to the second electrode of the second one of the pair of transistors, a second electrode coupled to the second voltage, and a control electrode coupled to the enable/disable signal. The fourth enable/disable transistor has a control electrode connected to a source of the first voltage level, a first electrode coupled to the enable/disable signal, and a second electrode connected to both the second electrode of the second enable/disable transistor and the control electrode of the first enable/disable transistor.

In one embodiment, a switch section is provided. The switch has first, second and third switch transistors. The first switch transistor has a control electrode connected to the source of the first voltage level, a first electrode coupled to the enable/disable signal and a second electrode. The second switch transistor has a first electrode connected to the source of the third voltage level, a second electrode connected to the second electrode of the first switch transistor, and a control electrode connected to the first electrode of the third enable/disable transistor. The third transistor has a first electrode coupled to the source of the third voltage level, a control electrode connected to both the second electrode of the first switch transistor and the second electrode of the second switch transistor, and a second electrode connected to the first electrode of the third enable/disable transistor.

The details of one or more embodiments of the invention are set forth in the accompanying drawings and the description below. Other features, objects, and advantages of the invention will be apparent from the description and drawings, and from the claims.

DESCRIPTION OF DRAWINGS

Like reference symbols in the various drawings indicate like elements.

DETAILED DESCRIPTION OF THE INVENTION

Figure 1:
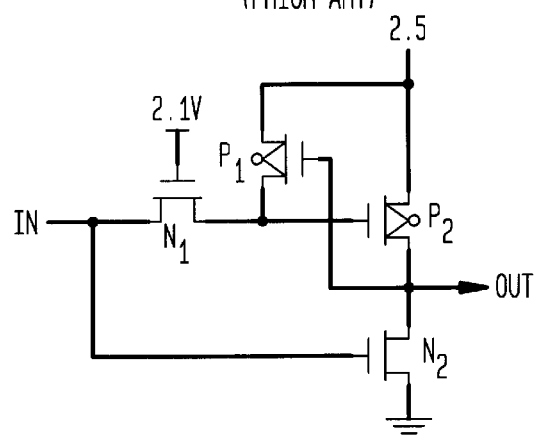
FIG. 1 is a schematic diagram of level-shifting circuitry according to the PRIOR ART.
Figure 2:
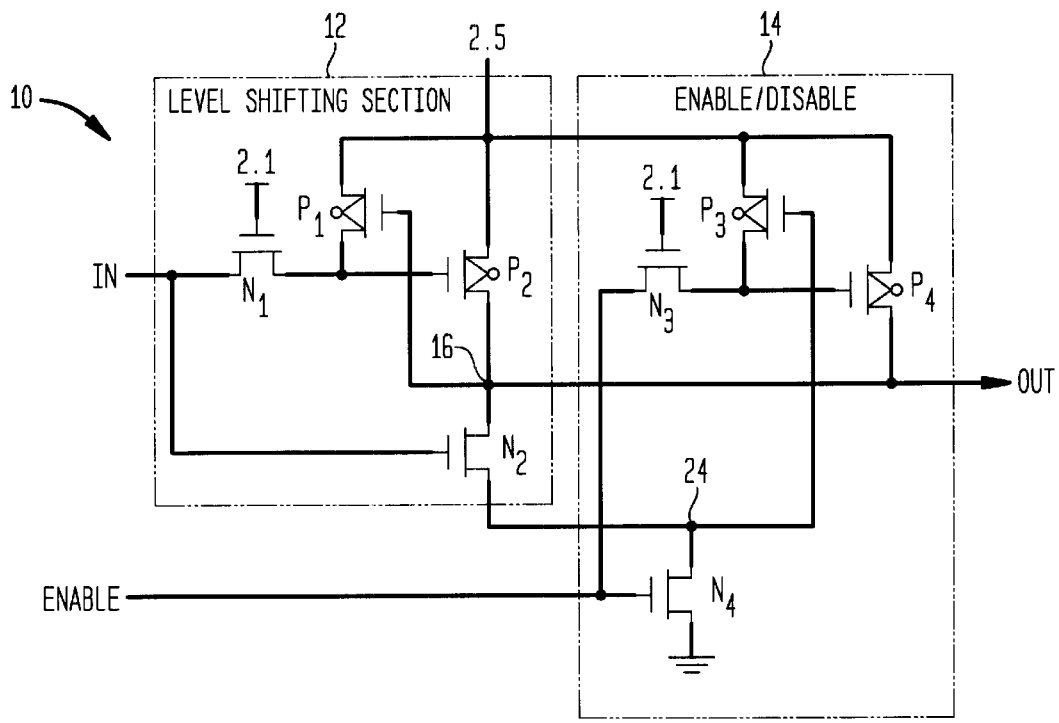
FIG. 2 is a schematic diagram of level-shifting circuitry according to the invention.

Referring now to FIG. 2, level-shifting circuitry 10 is shown to include: a level-shifting section 12 responsive to a input logic signal IN and an enable/disable section 14 fed by an enable/disable signal ENABLE. The input logic signal IN has a first voltage level, here +2.1 volts representative of a first input logic state, here logic 1, and a second voltage level, here ground, representative of a second input logic state, here logic 0.

The level-shifting section 10 provides an output logic signal OUT. The output logic signal OUT has a third voltage level, here +2.5 volts representative of the first output logic state, here logic 1, or the second voltage, here ground, representative of the second output logic state, here logic 0. Here, during the enable mode (to be described hereinafter), in response to the input logic signal IN having an input logic 1 state (i.e., +2.1 volts), the output logic signal OUT will be ground thereby representing an output logic 0 state. On the other hand, during the enable mode, in response to the input logic signal IN having an input logic 0 state, here ground, the output logic signal OUT will be +2.5 volts thereby representing an output logic 1 state.

More particularly, the level-shifting section 10 includes an input transistor $N_1$ having a control electrode, here gate electrode, coupled to a source of the first voltage level, here +2.1 volts, an first electrode coupled to the input logic signal IN, and a second electrode. The level-shifting section 10 also includes an output pair of serially connected complementary type transistors, P type MOSFET $P_2$ and N type MOSFET $N_2$. The first one of the pair of transistors, here transistor $P_2$ has a first electrode coupled to a source of the third voltage level, here +2.5 volts, here from an external voltage source, not shown, and a control, or gate electrode coupled to the second electrode of the input transistor. The pair of transistors $P_2$, $N_2$ is connected together at a junction 16. The junction 16 provides the output OUT for the level-shifting circuitry 10. A control, or gate electrode of the second one of the pair of transistors, $N_2$ is connected to the first electrode of the input transistor $N_1$. An additional transistor $P_1$ has: a control, or gate electrode connected to the junction 16; a first electrode coupled to the source of the third voltage level; and, a second electrode connected to both the second electrode of the input transistor, N type MOSFET $N_1$ and the control electrode of the first one of the pair of transistors $P_2$.

The circuitry 10 also includes, as noted above, the enable/disable section 14 which section 14 is responsive to the enable/disable signal ENABLE. The enable/disable signal ENABLE is a logic signal having the first voltage, here +2.1 volts during the enable mode and having the second voltage level, here ground, during the disable mode. The enable/disable section 14 drives the output OUT of the level-shifting circuit 10 to a predetermined voltage level, here to the third voltage level (i.e., +2.5 volts) during the disable mode.

More particularly, the enable/disable section 14 includes a first enable/disable transistor P type MOSFET $P_4$ having a first electrode connected to the source of the third voltage level (i.e., +2.5 volts), a second electrode connected to the junction 16, and a control, or gate electrode. The section 14 includes second enable/disable transistor P type MOSFET $P_3$ having a first electrode connected to the source of the third voltage level (i.e., +2.5 volts), a second electrode, and a control, or gate, electrode connected to the second electrode of the second one of the pair of transistors $N_2$ of the level-shifting section 12. A third enable/disable transistor N type MOSFET $N_4$ has a first electrode coupled to the second electrode of the second one of the pair of transistors $N_2$; a second electrode coupled to the second voltage level, i.e., ground, and a control, or gate electrode coupled to the enable/disable signal ENABLE. A fourth enable/disable transistor N type MOSFET $N_3$ has: a control, or gate, electrode connected to the source of the first voltage level (i.e., +2.1 volts); a first electrode coupled to the enable/disable signal ENABLE; and, a second electrode connected to both the second electrode of the second enable/disable transistor $P_3$ and the control electrode of the first enable/disable transistors $P_4$. The transistors $P_3$ and $P_4$ have their bulk connected to the source of the +2.5 volts.

It should be noted that here the input transistor $N_1$, the second one of the pair of transistors $N_2$ in the level-shifting section 12, the third and fourth enable/disable transistors $N_3$ and $N_4$ are N MOSFETs whereas the additional transistor $P_1$, the first one of the pair of transistors P2 of the level-shifting section 12, the first and second enable/disable transistors $P_3$ and $P_4$ are P MOSFETs.

In operation, during the disable mode, the enable/disable signal ENABLE is logic 0, here ground, and therefore transistor $N_4$ is "off" independent on the logic state of the input logic signal IN. Further, transistor $N_3$ is "on" independent of the logic state of the input logic signal IN. Thus, transistor $P_4$ is driven "on" independent of the logic state of the input logic signal IN. Because transistor $P_4$ is driven "on", the output OUT is driven to the third voltage, here +2.5 volts independent of the logic state of the input signal IN.

During the enable mode, the enable/disable signal ENABLE is logic 1, here the first voltage +2.1 volts and therefore transistor $N_3$ is "off" independent of the logic state of the input logic signal IN, transistor $N_4$ is "on", thus transistor $P_3$ is "on", thus transistor $P_4$ is "off". Therefore, in the enable mode, when the input signal IN is logic 0, here ground, transistor $N_1$ is "on" thereby placing transistor $P_2$ "on" and transistor $N_2$ is "off". When transistor $P_2$ is "on", the output OUT is output logic 1, here +2.5 volts. During the enable mode, when the input logic signal IN is logic 1, here +2.1 volts, transistor $N_1$ is "off", transistor $N_2$ is "on" (along with transistor $N_4$ which is always "on" during the enable mode), and transistor $P_2$ is "off" thereby placing the output OUT at an output logic 0 state, here ground.

It should be noted that transistor $N_3$ is a low threshold Vt FET. Thus, during the disable mode, junction 24 is floating and therefore transistor $P_3$ is not entirely off. In the case where the threshold voltage Vt of transistor $N_3$ tend to zero, because of process variations, a leakage path may be formed from the +2.5 volt supply, through transistors $P_3$ and $N_3$ to the enable/disable signal ENABLE.

Figure 3:
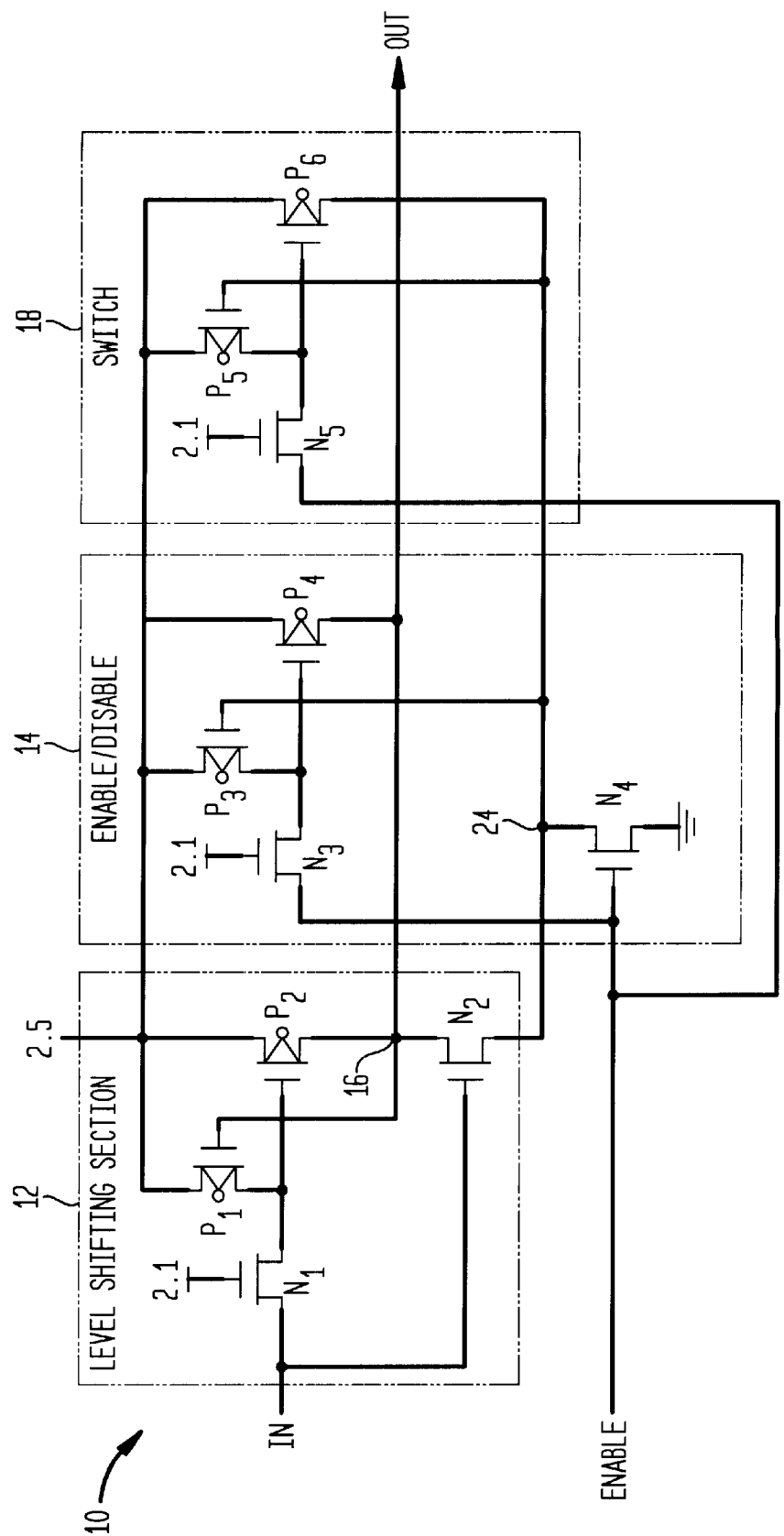
FIG. 3 is a schematic diagram of level-shifting circuitry according another embodiment of the invention.

In order to prevent such leakage, the level-shifter circuitry 10 may be modified by providing a switch section 18, as shown in FIG. 3. The switch section 18 includes a first switch transistor N type MOSFET $N_5$ having a control, or gate electrode connected to the first voltage (i.e., +2.1 volts), a first electrode coupled to the enable/disable signal ENABLE, and a second electrode. A second switch transistor P type MOSFET $P_5$ has a first electrode connected to the source of the third voltage level (+2.5 volts), a second electrode connected to the second electrode of the first switch transistor, and a control electrode connected to the first electrode of the third enable/disable transistor $N_4$. A third transistor P MOSFET $P_6$ has a first electrode coupled to the source of the third voltage level (+2.5 volts), a control, or gate electrode connected to both the second electrode of the first switch transistor $N_5$ and the second electrode of the second switch transistor $P_5$; and, a second electrode connected to the first electrode of the third enable/disable transistor $N_4$. Further, the first switching transistor $N_5$ is an N MOSFET and the second and third switch transistors $P_5$ and $P_6$ are P MOSFETs.

In operation, during the disable mode, transistor $P_6$ conducts and clamps terminal 24 to a high voltage (here, +2.5 volts) thereby switching transistor $P_3$ off and thus preventing leakage current through transistor $P_3$ A number of embodiments of the invention have been described. Nevertheless, it will be understood that various modifications may be made without departing from the spirit and scope of the invention. Accordingly, other embodiments are within the scope of the following claims.

What is claimed is:

1. Level-shifting circuitry, comprising:

a level-shifting section responsive to an input logic signal, such input logic signal having a first voltage level representative of a first logic state or a second voltage level representative of a second logic state, such level-shifting section providing an output logic signal, such output logic signal having a third voltage level representative of the first logic state of the input logic signal, such section having:

an input transistor having a control electrode, a first electrode coupled to the input logic signal, and a second electrode;

an output pair of serially coupled complementary type transistors, a first one of the pair of transistors having: a first electrode coupled to a source of the third voltage level and a control electrode coupled to the second electrode of the input transistor, a junction between the output pair of transistors, such junction providing an output terminal for the level-shifting circuitry; and wherein a control electrode of the second one of the pair of transistors is connected to the first electrode of the input transistor; and an enable/disable section responsive to an enable/disable signal, such enable/disable signal having the first voltage level during an enable mode and having the second voltage level during a disable mode, such enable/disable section driving the output logic signal to the third voltage level during the disable mode.

2. The circuitry recited in claim 1, including an additional transistor having a control electrode connected to the junction, a first electrode coupled to the source of the third voltage level and a second electrode connected to the second electrode of the input transistor.

3. The circuitry recited in claim 2, wherein the input transistor and the additional transistor are of opposite conductivity type.

4. The circuitry recited in claim 1, wherein the enable/disable section the enable/disable signal has the first voltage level during the enable mode and the second voltage level during the disable mode, such enable/disable section driving the output terminal of the level-shifting circuit to the third voltage level during the disable mode, such third voltage level being greater than the first and second voltage levels.

5. The circuitry recited in claim 4, wherein the enable/disable section includes:

a first enable/disable transistor having a first electrode connected to the source of the third voltage level, a second electrode connected to the junction, and a control electrode; and a second enable/disable transistor having a first electrode connected to the source of the third voltage level, a second electrode, and a control electrode connected to the second electrode of the second one of the pair of transistors of the level-shifting section;

a third enable/disable transistor having a first electrode coupled to the second electrode of the second one of the pair of transistors of the level-shifting section, a second electrode coupled to the second voltage level, a control electrode coupled to the enable/disable signal; and a fourth enable/disable transistor having a control electrode connected to a source of the first voltage level, a first electrode coupled to the enable/disable signal and a second electrode connected to the second electrode of the second enable/disable transistor and the control electrode of the first enable/disable transistors.

6. The circuitry recited in claim 5, including an additional transistor having a control electrode connected to the junction, a first electrode coupled to the source of the third voltage level and a second electrode connected to the second electrode of the input transistor.

7. The circuitry recited in claim 6, wherein the input transistor and the additional transistor are of opposite conductivity type.

8. Level-shifting circuitry, comprising:

a level-shifting section responsive to an input logic signal, such input logic signal having a first voltage level representative of a first logic state and a second voltage level representative of a second logic state, such level-shifting section providing an output logic signal, such output logic signal having a third voltage level representative of the first logic state of the input logic signal, the level shifting section having:

an input transistor having a control electrode, a first electrode coupled to the input logic signal, and a second electrode, such control electrode coupled to a source of the first voltage level; and an output pair of serially connected complementary type transistors, a first one of the pair of transistors having a first electrode coupled to a source of the third voltage level and a control electrode coupled to the second electrode of the input transistor, a junction between the output pair of transistors, such junction providing an output terminal for the level-shifting circuitry, and wherein a control electrode of the second one of the pair of transistors is connected to the first electrode of the input transistor;

an additional transistor having a control electrode connected to the junction, a first electrode coupled to the source of the third voltage level and a second electrode connected to a second electrode of the input transistor and the control electrode of the first one of the pair of transistors;

an enable/disable section responsive to an enable/disable signal, such enable/disable signal having the first voltage level during an enable mode and having the second voltage level during a disable mode, such enable/disable section driving the output terminal of the level-shifting circuit to a predetermined voltage level during the disable mode; and wherein the enable/disable section includes:

a first enable/disable transistor having a first electrode connected to the third voltage, a second electrode connected to the junction, and a control electrode; and a second enable/disable transistor having a first electrode connected to the source of the third voltage level, a second electrode, and a control electrode connected to the second electrode of the second one of the pair of transistors of the level-shifting section;

a third enable/disable transistor having a first electrode coupled to the second electrode of the second one of the pair of transistors of the level-shifting section, a second electrode coupled to the second voltage level, a control electrode coupled to the enable/disable signal; and a fourth enable/disable transistor having a control electrode connected to the source of the first voltage level, a first electrode coupled to the enable/disable signal and a second electrode connected to the second electrode of the second enable/disable transistor and the control electrode of the first enable/disable transistors.

9. The level-shifting circuitry recited in claim 8, including a switch section, such switch section comprising:
- a first switch transistor having a control electrode connected to the source of the first voltage level, a first electrode coupled to the enable/disable signal and a second electrode;
- a second switch transistor having a first electrode connected to the source of the third voltage level, a second electrode connected to the second electrode of the first switch transistor, and a control electrode connected to the first electrode of the third enable/disable transistor;
- a third transistor having a first electrode coupled to the source of the third voltage level, a control electrode connected to the second electrode of the first switch transistor, the second electrode of the first switch transistor, and a second electrode connected to the first electrode of the third enable/disable transistor.

10. The level-shifting circuitry recited in claim 9, wherein the second electrode of the third transistor of the enable/disable section is coupled to the second voltage level.

11. The level-shifting circuitry recited in claim 10, wherein the input transistor, the second one of the pair of transistors in the level-shifting section, the third and fourth enable/disable transistors and the first switching transistor are N MOSFETs and the additional transistor, the first one of the pair of transistors of the level-shifting section, the first and second enable/disable transistor, and the second and third switch transistors are P MOSFETs.

* * * * *